(12) United States Patent
Shin et al.

(10) Patent No.: US 8,964,498 B2
(45) Date of Patent: Feb. 24, 2015

(54) SYSTEMS AND METHODS FOR REDUCING PEAK POWER CONSUMPTION IN A SOLID STATE DRIVE CONTROLLER

(71) Applicant: Marvell World Trade Ltd., St. Michael (BB)

(72) Inventors: Hyunsuk Shin, San Diego, CA (US); Jungil Park, San Jose, CA (US); Chi Kong Lee, Fremont, CA (US); Chih-Ching Chen, Milpitas, CA (US)

(73) Assignee: Marvell World Trade Ltd., St. Michael (BB)

( * ) Notice: Subject to any disclaimer, the term of this patent is extended or adjusted under 35 U.S.C. 154(b) by 276 days.

(21) Appl. No.: 13/676,864

(22) Filed: Nov. 14, 2012

(65) Prior Publication Data

US 2013/0121089 A1    May 16, 2013

Related U.S. Application Data

(60) Provisional application No. 61/560,186, filed on Nov. 15, 2011.

(51) Int. Cl.
 *G11C 16/32* (2006.01)
 *G11C 5/14* (2006.01)
 *G11C 16/30* (2006.01)

(52) U.S. Cl.
 CPC . *G11C 5/14* (2013.01); *G11C 16/30* (2013.01)
 USPC .. 365/227; 365/206; 365/189.04; 365/185.17

(58) Field of Classification Search
 USPC .................... 365/227, 206, 189.04, 185.17
 See application file for complete search history.

(56) References Cited

U.S. PATENT DOCUMENTS

| | | | |
|---|---|---|---|
| 3,890,466 A * | 6/1975 | Bauer | 381/23 |
| 5,644,773 A | 7/1997 | DiMarco | |
| 6,175,327 B1 * | 1/2001 | Lin et al. | 342/357.64 |
| 7,091,828 B2 * | 8/2006 | Greeff et al. | 340/10.3 |
| 8,064,824 B2 * | 11/2011 | Karabinis | 455/13.4 |
| 8,086,282 B2 * | 12/2011 | Hellberg | 455/574 |
| 8,428,277 B1 * | 4/2013 | Skoglund et al. | 381/104 |
| 8,681,412 B2 * | 3/2014 | Widzgowski et al. | 359/285 |
| 2006/0044029 A1 | 3/2006 | Gomm et al. | |
| 2006/0176944 A1 * | 8/2006 | Barmettler | 375/226 |
| 2010/0158083 A1 | 6/2010 | Morris et al. | |
| 2011/0304900 A1 * | 12/2011 | Widzgowski et al. | 359/287 |

FOREIGN PATENT DOCUMENTS

WO    WO-2007136944    6/2007

OTHER PUBLICATIONS

International Search Report and Written Opinion dated Mar. 5, 2013 in International Application No. PCT/US2012/065045.

* cited by examiner

*Primary Examiner* — Huan Hoang
*Assistant Examiner* — Jay Radke (57) ABSTRACT

In accordance with an embodiment of the disclosure, systems and methods are provided for reducing an amount of peak power consumption in a device. In certain implementations, a first signal and a second signal are received, wherein the first signal and the second signal are indicative of amounts of power consumption in a device. The first signal is combined with the second signal to generate a combined signal, and at least a portion of the second signal is shifted in time to cause a combination of the first signal and the shifted portion to have a peak amplitude less than a peak amplitude of the combined signal.

20 Claims, 8 Drawing Sheets

SYSTEMS AND METHODS FOR REDUCING PEAK POWER CONSUMPTION IN A SOLID STATE DRIVE CONTROLLER

CROSS REFERENCE TO RELATED APPLICATION

This application claims the benefit under 35 U.S.C. §119 (e) of U.S. Provisional Application No. 61/560,186, filed on Nov. 15, 2011, which is incorporated herein by reference in its entirety.

FIELD OF USE

The present disclosure relates generally to peak power reduction systems and methods, and, more particularly, to systems and methods for reducing peak power consumption in a solid state drive controller.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

A sold state drive (SSD) may read and write data from devices such as NAND flash memory devices or dynamic random access memory (DRAM) devices. In particular, the SSD typically includes an SSD controller with a number of data channels for transferring data to and from a NAND flash device. For example, one data channel may include multiple NAND flash devices. Each data channel has a power profile, indicative of an amount of power consumed by operations over the channel as a function of time. In a device with multiple channels, the power profiles across the multiple channels may overlap, resulting in a high likelihood that the combined amount of consumed power over the multiple channels is large at some point in time.

SUMMARY

In accordance with an embodiment of the disclosure, systems and methods are provided for reducing an amount of peak power consumption in a device. In certain implementations, a first signal and a second signal are received, wherein the first signal and the second signal are indicative of amounts of power consumption in a device. The first signal is combined with the second signal to generate a combined signal, and at least a portion of the second signal is shifted in time to cause a combination of the first signal and the shifted portion to have a peak amplitude less than a peak amplitude of the combined signal.

In certain implementations, the device is a NAND flash device in a sold state drive.

In certain implementations, combining the first signal with the second signal comprises summing the first signal and the second signal.

In certain implementations, an overlapping interval is identified, during which a first portion of the first signal overlaps in time with a second portion of the second signal. In certain implementations, the first portion is indicative of data being transferred over a first channel, and the second portion is indicative of data being transferred over a second channel.

In certain implementations, shifting the portion comprises interleaving first portions of the first signal with second portions of the second signal.

In certain implementations, the first signal includes a first plurality of transients, and the second signal includes a second plurality of transients.

In certain implementations, a system for reducing an amount of peak power consumption in a device comprises a receiver configured to receive a first signal and a second signal, wherein the first signal and the second signal are indicative of amounts of power consumption in a device. The system further comprises a circuitry configured to combine the first signal with the second signal to generate a combined signal and shift at least a portion of the second signal in time, causing a combination of the first signal and the shifted portion to have a peak amplitude less than a peak amplitude of the combined signal.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

To provide an overall understanding of the present disclosure, certain illustrative embodiments will now be described, including a system for reducing an amount of peak power consumption in a device. However, it will be understood by one of ordinary skill in the art that the systems and methods described herein may be adapted and modified as appropriate for the application being addressed and that the systems and methods described herein may be employed in other suitable applications, and that such other additions and modifications will not depart from the scope of the present disclosure.

For illustrative purposes, the systems and methods disclosed herein are described in relation to a memory system such as a solid state drive using NAND flash memory devices. In general, any device may be used, such as any memory device with multiple channels, in accordance with the systems and methods disclosed herein. Moreover, the present disclosure is also applicable to any system that consumes power and it is desirable to reduce an amount of peak power consumed by a device. One of ordinary skill in the art will appreciate that reduction of peak power consumption systems such as those described herein are applicable to any number of devices that consume power.

Figure 1:
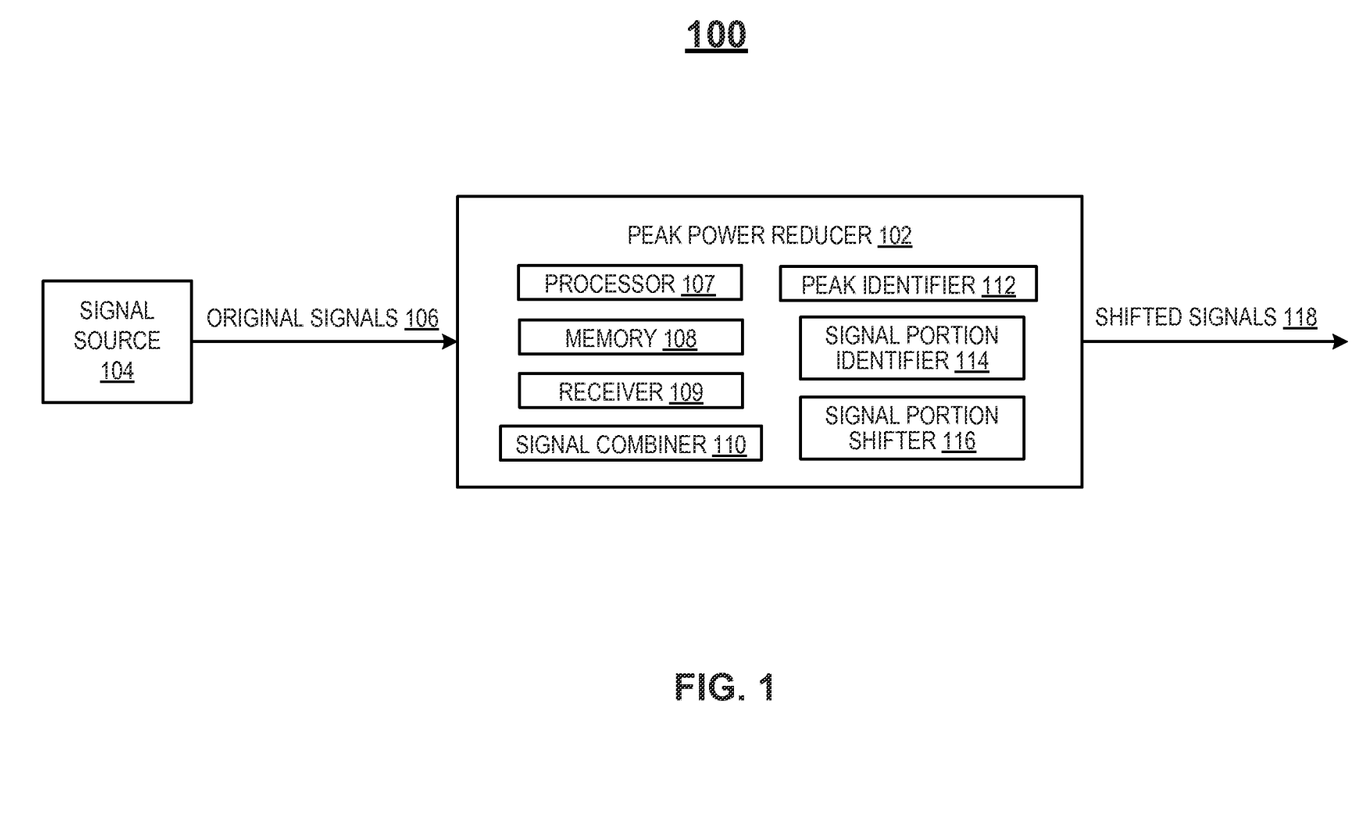
FIG. 1 shows an illustrative block diagram of a peak power reducer, in accordance with an embodiment of the disclosure.

FIG. 1 shows an illustrative block diagram of a system 100 for reducing an amount of peak power consumption, in accordance with an illustrative embodiment of the present disclosure. System 100 includes a peak power reducer 102, which receives original signals 106 from a signal source 104 and outputs shifted signals 118.

Signal source 104 provides one or more signals to peak power reducer 102, and can be any source of a signal. The signal may be a continuous signal or a discretized version of a continuous signal. As an example, signal source 104 may include a device that monitors activity over a channel in a memory device (such as a SSD, for example), and the signal may be a vector of discrete samples corresponding to whether data is being transferred over the channel as a function of time. In another example, the signal may be a vector of discrete samples corresponding to amounts of power consumed by transferring data over the channel as a function of time. In another example, the signal may be a vector of binary values corresponding to whether a channel in a device is in a "ready" or "busy" state. In another example, the signal may be a vector of power consumption values corresponding to an amount of power consumed when the channel is in a busy state. Signal source 104 may further be configured to process the signal to get the signal into a certain form, such as by controlling the amplitude of the signal or adjusting other characteristics of the signal. For example, the signal source 104 may quantize, filter, smooth, downsample, upsample, or interpolate the signal, or perform any number of processing techniques on the signal. In general, any signal source may be used, if it is desirable to shift one or more signals to reduce a peak amount of power consumption in a device.

Peak power reducer 102 reduces an amount of peak power consumption in a device. In particular, the system may include multiple channels, which each consume power. Each channel may have a power profile as a function of time, indicative of an amount of power consumed by the channel at a point in time. The original signals 106 transmitted from signal source 104 to peak power reducer 102 may be indicative of these power profiles. Peak power reducer 102 includes processor 107, memory 108, receiver 109, signal combiner 110, peak identifier 112, signal portion identifier 114, and signal portion shifter 116. As used herein, the term "processor" or "computing device" refers to one or more computers, microprocessors, logic devices, servers, or other devices configured with hardware, firmware, and/or software to carry out one or more of the techniques described herein. An illustrative computing device 1300, which may be used to implement any of the processors or devices described herein, is described in detail below with reference to FIG. 13. Memory 108 is configured to store input data, output data, and data currently being processed by processor 107, signal combiner 110, peak identifier 112, signal portion identifier 114, or signal portion shifter 116.

Receiver 109 receives original signals 106 from signal source 104. As described above, original signals 106 may be indicative of power profiles corresponding to amounts of power consumed by channels in a device. Examples of power profiles and original signals 106 are shown and described in detail in relation to FIGS. 2-10.

After receiver 109 receives original signals 106, signal combiner 110 may combine original signals 106 to generate a combined signal. For example, to generate the combined signal, original signals 106 may be summed together. The combined signal is representative of a total power profile, indicative of amounts of power consumed by the system (over multiple channels) as a function of time. Examples of combined signals are shown and described in detail in relation to FIGS. 3-10.

Then, peak identifier 112 may identify a maximum amount of combined peak power, corresponding to a peak value in the combined signal generated by signal combiner 110. This maximum amount may be compared to a threshold to determine whether a combined amount of power consumed by the system ever exceeds a set threshold. If the maximum amount exceeds the threshold, signal portion identifier 114 identifies one or more portions of one or more original signals 106 to shift, and signal portion shifter 116 shifts the identified portion(s) by an appropriate amount such that the resulting total power profile (after shifting) has a smaller peak value than the original total power profile (before shifting). Shifted signals 118 are then provided as outputs of peak power reducer 102.

By shifting one or more portions of one or more original signals 106, peak power reducer 102 therefore reduces an amount of peak power consumed by a system.

Figure 2:
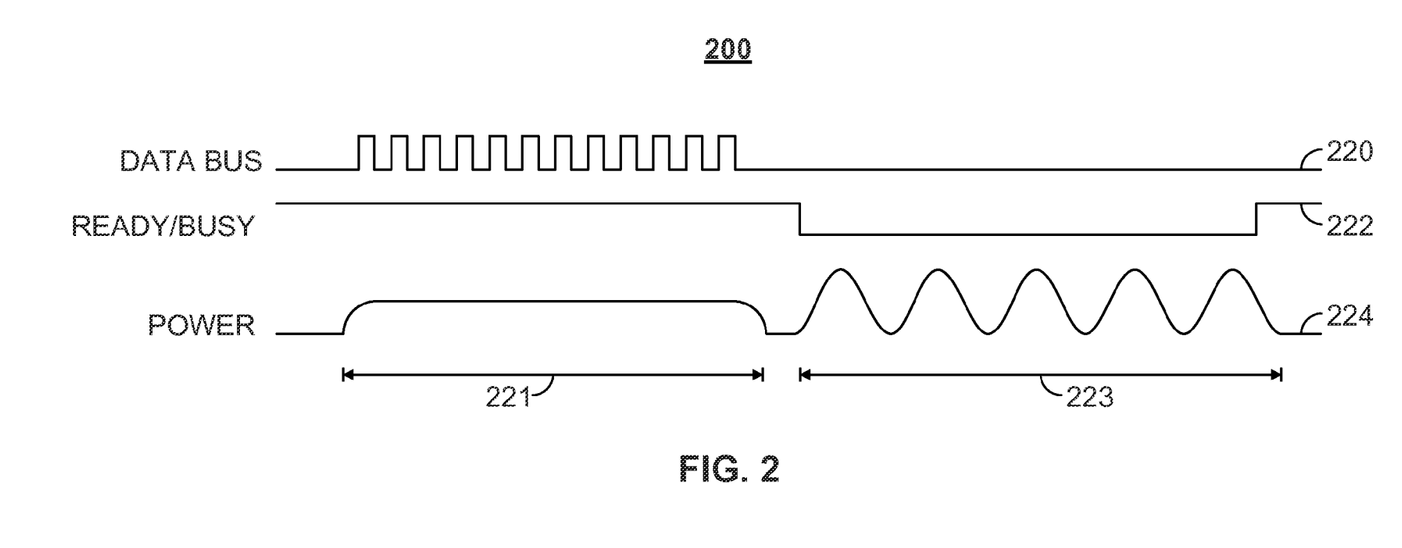
FIG. 2 shows an illustrative diagram of signals in a device, in accordance with an embodiment of the disclosure.

FIG. 2 shows an illustrative diagram 200 of example signals for a channel, according to an illustrative embodiment of the present disclosure. Diagram 200 includes a data bus signal 220, a ready/busy signal 222, and a power signal 224. Data bus signal 220 is binary valued and is indicative of times of data transfer over the channel. In particular, data bus signal 220 is high when data is being transmitted over the channel and low when data is not being transmitted over the channel. Ready/busy signal 222 is also binary valued and is indicative of a status of the channel. In particular, ready/busy signal 222 is high when the channel is in a ready state, and low when the channel is in a busy state.

In particular, the channel may be a data channel for transferring data between an SSD controller and a NAND flash device. The NAND flash device may have two phases of power consumption. The first phase may be a data transfer phase, which may correspond to interval 221, when data is transferred over the signal during read and write operations. The second phase may be a memory array operation phase, which may correspond to interval 223, when the channel is in a busy state during read, write, and erase operations. When the channel is in a ready state (i.e., first phase, when ready/busy signal 222 is high), data is being transmitted over the channel. Transmitting data over the channel consumes essentially a fixed amount of power during interval 221 (i.e., power signal 224 is mostly flat during interval 221). In particular, when data is being transmitted over the channel, the power profile rises for a short amount of time at the onset of interval 221, remains flat for most of the duration of interval 221, and falls for a short amount of time at the end of interval 221. When the channel is in a busy state (i.e., second phase, when ready/busy signal 222 is low), the power profile fluctuates during interval 223 and exhibits times of low power consumption and high power consumption. In particular, the times of high power consumption may correspond to times when the NAND flash device is performing one or more memory array operations. As an example, data may be read to, written from, or erased from a memory cell in the NAND flash device. The times of lower power consumption may correspond to times in between operations. In particular, the number of times the power consumption is high may correspond to a size of the NAND flash device. As an example, if the NAND flash device has a page size of 2048 bytes, the number of times of high power consumption in a power profile may be 2048. In general, any suitable size of the NAND flash device may be used, and the power signal may be sinusoidal, saw tooth, square wave, periodic, aperiodic, or any other suitable type of power signal.

Figure 3:
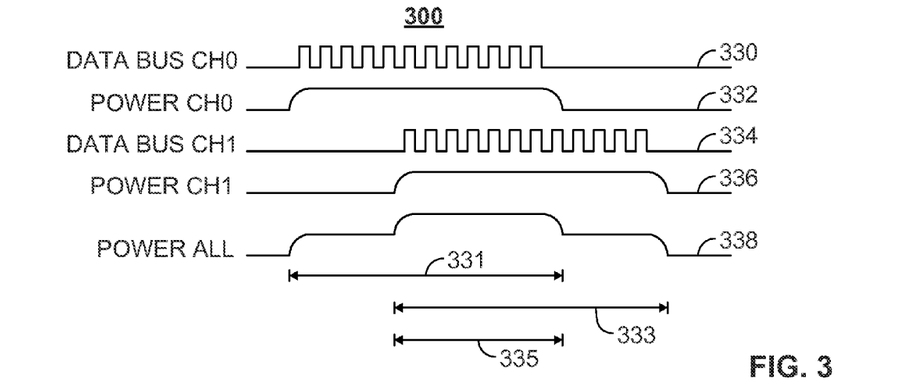
FIG. 3 shows an illustrative diagram of original data transfer power signals in a device, in accordance with an embodiment of the disclosure.
Figure 4:
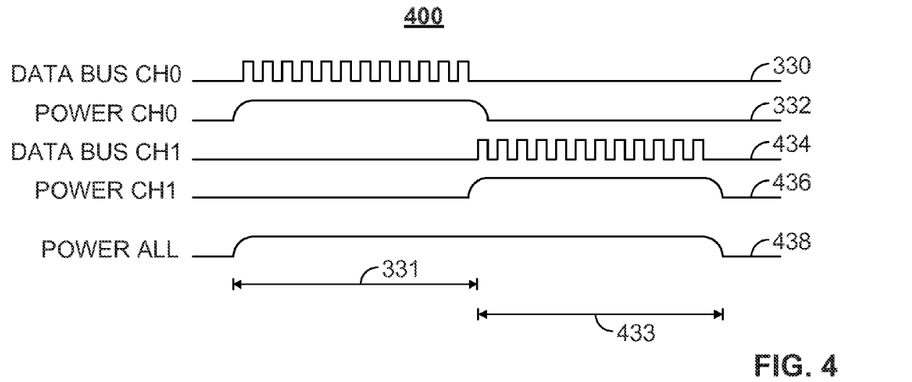
FIG. 4 shows an illustrative diagram of shifted data transfer power signals in a device, in accordance with an embodiment of the disclosure.
Figure 5:
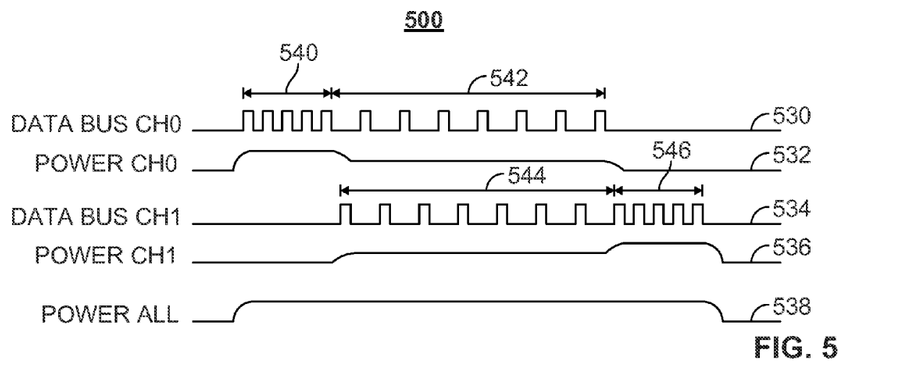
FIG. 5 shows an illustrative diagram of interleaved data transfer power signals in a device, in accordance with an embodiment of the disclosure.
Figure 6:
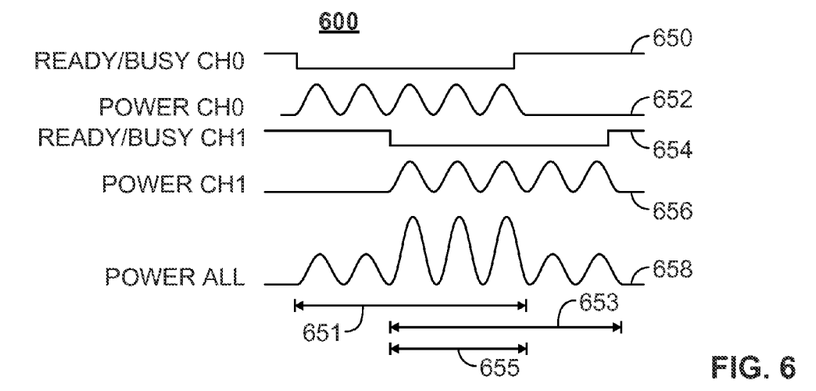
FIG. 6 shows an illustrative diagram of original memory array operation power signals in a device, in accordance with an embodiment of the disclosure.
Figure 7:
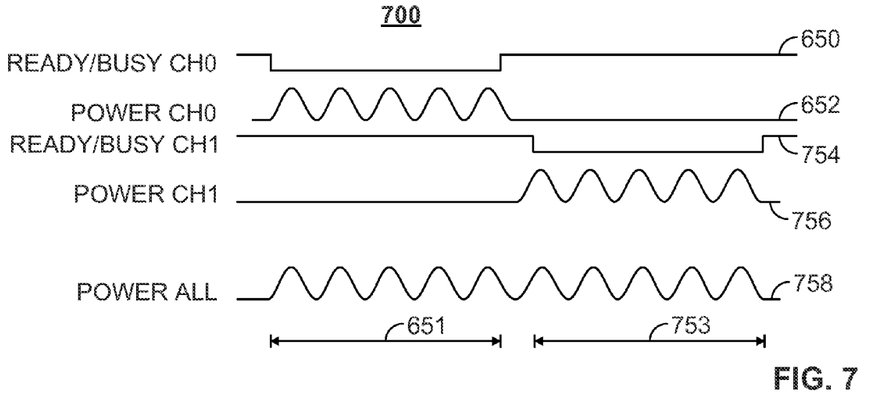
FIG. 7 shows an illustrative diagram of shifted memory array operation power signals in a device, in accordance with an embodiment of the disclosure.
Figure 8:
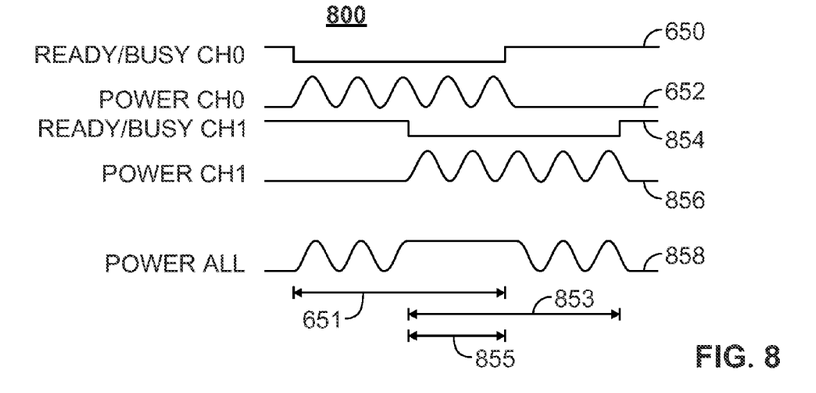
FIG. 8 shows an illustrative diagram of interleaved memory array operation power signals in a device, in accordance with an embodiment of the disclosure.
Figure 9:
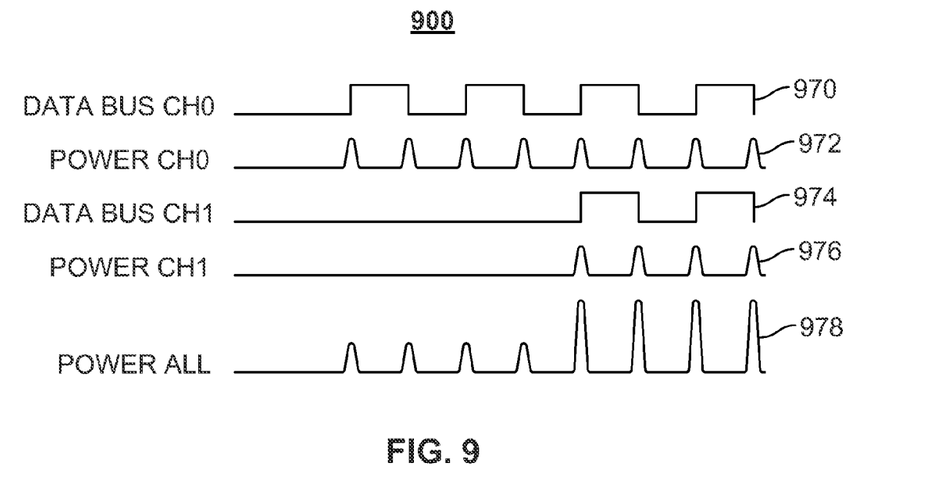
FIG. 9 shows an illustrative diagram of original data transition power signals in a device, in accordance with an embodiment of the disclosure.
Figure 10:
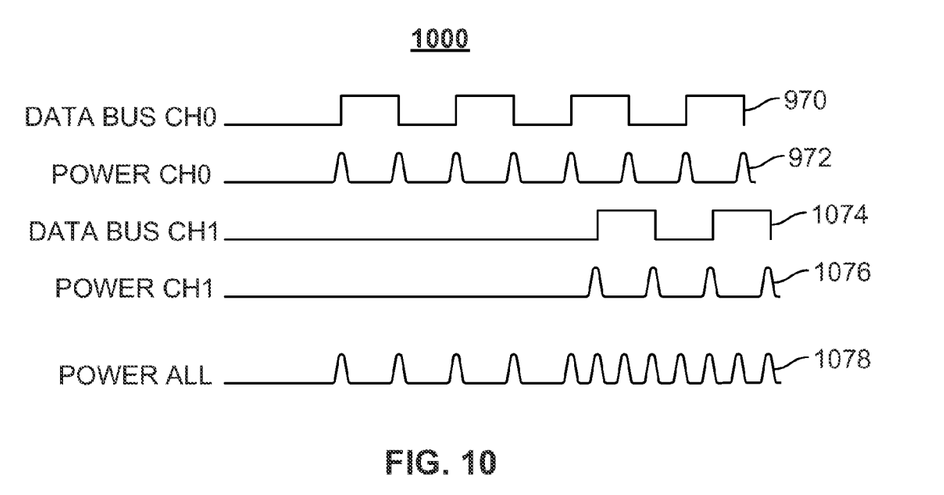
FIG. 10 shows an illustrative diagram of shifted data transition power signals in a device, in accordance with an embodiment of the disclosure.

FIGS. 3-10 show illustrative diagrams 300-900 of power signals in a device. In particular, FIGS. 3, 6 and 9 show examples of original signals 106 that are received by peak power reducer 102. The original signals 106 are representative of amounts of power consumed by the device during data transfer (FIG. 2), memory array operations (FIG. 6), and data transitions (FIG. 9). As described in relation to FIGS. 11 and 12, peak power reducer 102 receives the original signals 106 and may determine to shift one or more of the original signals to produce shifted signals 118. FIGS. 4-5, 7-8, and 10 show examples of resultant shifted power signals 118 that are provided by peak power reducer 102. In particular, the shifted signals 118 are representative of amounts of power consumed by the device during data transfer (FIGS. 4-5), memory array operations (FIGS. 7-8), and data transitions (FIG. 10). Peak power reducer 102 may be configured to use any of these techniques, as well as any combination of these techniques, to reduce an amount of peak power consumed by a system.

FIGS. 3-5 show examples of power signals indicative of amounts of consumed power from data being transferred over channels in a device, in accordance with an illustrative embodiment of the present disclosure. In particular, FIG. 3 shows example original signals 106, which may be provided as input to peak power reducer 102, and FIGS. 4 and 5 show example shifted signals 118.

FIG. 3 shows a diagram 300, which includes two data bus signals 330 and 334, two power signals 332 and 336, and a combined power signal 338. The data bus signals 330 and 324 are each indicative of times of data transfer over a channel. For example, data bus signal 330 has binary values (i.e., zero and one), and has a high value when data is being transferred over a first channel and a low value when no data is being transferred over the first channel. Similarly, data bus signal 334 is a binary signal indicative of when data is being transferred over a second channel. Data may be transferred over the channel in sets of one or more packets. In this case, the transients in the data bus signals 330 and 334 may be indicative of one or more data packets being transmitted over a channel.

Similarly, the power signals 332 and 336 are representative of amounts of power consumed by the device resulting from the data transfer from data bus signals 330 and 334, respectively. In particular, the power signal 332 is low when data is not being transferred over the first channel and high when data is being transferred over the first channel. Interval 331 corresponds to the time interval during which data is being transferred over the first channel, and therefore the power signal 332 is high. Similarly, interval 333 corresponds to the time interval during which data is being transferred over the second channel, and therefore the power signal 336 is high.

In an example, receiver 109 in peak power reducer 102 receives the power signals 332 and 336 from signal source 104. Then, signal combiner 110 combines the power signals 332 and 336 to generate combined power signal 338. In particular, combined power signal 338 may be based on a sum of the power signals 332 and 336, or, in general, may be based on any linear combination of the power signals 332 and 336. After combined power signal 338 is generated, peak identifier 112 identifies a peak value of combined power signal 338, and peak power reducer 102 may then compare the identified peak value to a predetermined threshold value. If the identified peak value is higher than the threshold, pear power reducer 102 may determine to shift one or more of the original data bus signals 330 and 334, or equivalently, to shift one or more of the original power signals 332 and 336. By shifting one or more of the original signals in time, peak power reducer 102 reduces an amount of peak power consumption in the device.

To determine an appropriate length of time to shift a signal, peak power reducer 102 may identify overlap interval 335, corresponding to the time interval during which data is being transferred over both the first and second channels. For example, the overlap interval 335 may be identified by identifying portions of combined power signal 338 that exceed a threshold. In another example, the overlap interval 335 may be identified by identifying portions of overlap between the intervals 331 and 333.

FIG. 4 shows a diagram 400 of shifted data transfer power signals in a device, in accordance with an illustrative embodiment of the present disclosure. As in diagram 300, diagram 400 includes a data bus signal 330 indicative of times of data transfer over a first channel and a corresponding power signal 332 representative of amounts of power consumed by the device resulting from the data transfer from data bus signal 330. Data bus signal 330 and power signal 332 in diagram 400 are the same signals as shown in diagram 300. In addition, diagram 400 includes a shifted data bus signal 434 indicative of times of data transfer over a second channel and a corresponding shifted power signal 436.

Shifted data bus signal 434 and shifted power signal 436 correspond to shifted versions of original data bus signal 334 and original power signal 336 in FIG. 3. In particular, peak power reducer 102 may identify overlap interval 335, corresponding to an interval during which data is transferred over both channels. Signal portion identifier 114 may then identify a portion of original power signal 336 to shift such that the resulting signal does not overlap with the original power signal 332. In an example, the identified portion of original power signal 336 may correspond to interval 333. Signal portion shifter 116 then delays the identified portion of original power signal 336 by an amount corresponding to overlap interval 335, resulting in shifted power signal 436. Shifted power signal 436 is high during an interval 433, which does not overlap with interval 331. Therefore, data is not transferred over both channels at the same time. Because intervals 331 and 433 do not overlap in time, the resulting combined power signal 438 has a lower peak amplitude than the original combined power signal 338. Thus, by shifting one of the power signals by an amount of time corresponding to overlap interval 335, peak power reducer 102 reduces an amount of peak power consumption in the device.

As described in relation to FIG. 4, one portion of a power signal is uniformly shifted in time. That is, after identifying a portion of data bus signal 334 to shift, a constant amount of shift (corresponding to overlap interval 335) is applied to the entire portion. However, in general, any number of power signals may be shifted in time to reduce the amount of peak power consumption in a device, and non-uniform amounts of shift may be applied to different parts of the signal. FIG. 5 shows an example of two non-uniformly shifted power signals to reduce an amount of peak power consumption.

FIG. 5 shows a diagram 500 of interleaved data transfer power signals in a device, in accordance with an illustrative embodiment of the present disclosure. In diagram 500, data bus signals 530 and 534 are shifted versions of original data bus signals 330 and 334. In particular, data bus signal 530 includes a first portion 540, during which data is transmitted at the same rate as in data bus signal 330. In addition, data bus signal 530 includes a second portion 542, during which, data is transmitted at half the rate of first portion 540. In particular, portion 540 is not shifted, and portion 542 is non-uniformly shifted. By non-uniformly shifting portion 542, signal portion shifter 116 shifted the early portion of portion 542 by an amount less than the amount that the later portion of portion 542 was shifted. By shifting portion 542 in this way, signal portion shifter 116 caused the data to be transmitted at half the original rate in portion 542.

Data bus signal 534 also includes two portions: a first portion 544, during which data is transmitted at a half rate, and a second portion 546, during which data is transmitted at the same rate as in data bus signal 330. Because different portions of portion 544 were shifted by different amounts of time (i.e., the early portion of portion 544 was shifted by a larger amount than the late portion of portion 544), portion 544 was non-uniformly shifted. In contrast, portion 546 was uniformly shifted, meaning that the entire portion 546 was shifted by a constant amount of time.

In general, non-uniform shifting occurs when the rate of data transfer changes (i.e., portions 542 and 544). Uniform shifting occurs when the rate of data transfer remains the same, and an entire signal portion is delayed or advanced by a constant amount. Signal portion shifter 116 is configured to shift any signal portion by any uniform or non-uniform amount.

When data is transmitted at the half rate (i.e., portions 542 and 544), the corresponding power signals 532 and 536 are half as high as when data is transmitted at the full rate (i.e., portions 540 and 546). Thus, even though portion 542 of shifted data bus signal 530 overlaps with portion 544 of shifted data bus signal 534, the combined amount of power consumed (i.e., combined power signal 538) is mostly flat. Importantly, combined power signal 538 has a lower peak amplitude than combined power signal 338. Thus, even though portions 542 and 544 overlap, the data transfers over the first and second channels are interleaved such that data is not transferred over both channels at the same time.

FIGS. 6-8 show examples of power signals indicative of amounts of consumed power from memory array operations in a device, in accordance with an illustrative embodiment of the present disclosure. In particular, FIG. 6 shows example original signals 106, which may be provided as input to peak power reducer 102, and FIGS. 7 and 8 show example shifted signals 118.

FIG. 6 shows a diagram 600, which includes two ready/busy signals 650 and 654, two power signals 652 and 656, and a combined power signal 658. The ready/busy signals 650 and 654 are each indicative of a status of the device. In particular, new commands may only be executed when the device is in a ready state, or when the read/busy signal is high. When a channel in the device is in a busy state (i.e., interval 651 for ready/busy signal 650 and interval 653 for ready/busy signal 654), the corresponding power signals 652 and 656 are sinusoidal, exhibiting times of low and high amounts of power consumption. When intervals 651 and 653 overlap (i.e., overlap interval 655), the combined power signal 658 exhibits a high amplitude sinusoid when the overlapping portions of power signals 652 and 656 are in phase.

In an example, receiver 109 in peak power reducer 102 receives the power signals 652 and 656 from signal source 104. Then, signal combiner 110 combines the power signals 652 and 656 to generate combined power signal 658. In particular, combined power signal 658 may be based on a sum of the power signals 652 and 656, or, in general, may be based on any linear combination of the power signals 652 and 656. After combined power signal 658 is generated, peak identifier 112 identifies a peak value of combined power signal 658, and peak power reducer 102 may then compare the identified peak value to a predetermined threshold value. If the identified peak value is higher than the threshold, peak power reducer 102 may determine to shift one or more of the original ready/busy signals 650 and 654, or, equivalently, to shift one or more of the original power signals 652 and 654. By shifting one or more of the original signals in time, peak power reducer 102 reduces an amount of peak power consumption in the device.

To determine an appropriate length of time to shift a signal, peak power reducer 102 may identify overlap interval 655, corresponding to the time interval during which both the first channel and the second channel are in a busy state. For example, the overlap interval 655 may be identified by identifying portions of combined power signal 658 that exceed a threshold. In another example, the overlap interval 655 may be identified by identifying portions of overlap between the intervals 651 and 653.

FIG. 7 shows a diagram 700 of shifted power signals in a device, in accordance with an illustrative embodiment of the present disclosure. As in diagram 600, diagram 700 includes a ready/busy signal 650 indicative of a status of a first channel and a corresponding power signal 652 representative of amounts of power consumed by the device. Ready/busy signal 650 and power signal 652 in diagram 700 are the same signals as shown in diagram 600. In addition, diagram 700 includes a shifted ready/busy signal 754 indicative of a status of a second channel and a corresponding shifted power signal 756.

Shifted ready/busy signal 754 and shifted power signal 756 correspond to shifted versions of original ready/busy signal 654 and original power signal 656 in FIG. 6. In particular, peak power reducer 102 may identify overlap interval 655, corresponding to an interval during which both channels are in a busy state. Signal portion identifier 114 may then identify a portion of ready/busy signal 654 and/or original power signal 656 to shift such that the resulting power signal does not overlap with the original power signal 652. In an example, the identified portion of original power signal 656 may correspond to interval 653. Signal portion shifter 116 then delays the identified portion of original power signal 656 by an amount corresponding to overlap interval 655, resulting in shifted power signal 756. Shifted power signal 756 has a sinusoidal profile during an interval 753, which does not overlap with interval 651. Therefore, both channels are not in a busy state at the same time. Because intervals 751 and 753 do not overlap in time, the resulting combined power signal 758 has a lower peak amplitude than the original combined power signal 658. Thus, shifting one of the power signals by an amount of time corresponding to overlap interval 655, peak power reducer 102 reduces an amount of peak power consumption in the device.

FIG. 8 shows a diagram 800 of shifted power signals in a device, in accordance with an illustrative embodiment of the present disclosure. As in diagram 600, diagram 800 includes a ready/busy signal 650 indicative of a status of a first channel and a corresponding power signal 652 representative of amounts of power consumed by the device. Ready/busy signal 650 and power signal 652 in diagram 800 are the same signals as shown in diagram 600. In addition, diagram 800 includes a shifted ready/busy signal 854 indicative of a status of a second channel and a corresponding shifted power signal 856.

Shifted ready/busy signal 854 and shifted power signal 856 correspond to shifted versions of original ready/busy signal 654 and original power signal 656 in FIG. 6. In particular, peak power reducer 102 may identify a relative phase of power signals 652 and 656 during overlap interval 655. As shown in FIG. 6, the portions of power signals 652 and 656 during overlap interval 655 are in phase. Signal portion identifier 114 may then identify a portion of ready/busy signal 654 and/or original power signal 656 to shift such that the resulting power signal is out of phase with the original power signal 652. In an example, the identified portion of original power signal 656 may correspond to interval 653. Thus, signal portion shifter 116 may delay power signal 656 by a half cycle to produce shifted power signal 858. In this case, shifted power signal 858 is 180 degrees out of phase with original power signal 652. Because the power signals are out of phase, the resulting combined power signal 858 is flat during overlap interval 855 (i.e., a time when both channels have a busy state). The combined power signal 858 has a lower peak amplitude than the original combined power signal 658. Thus, by shifting one of the power signals by an amount of time such that the power signals 652 and 856 are out of phase, peak power reducer 102 reduces an amount of peak power consumption in the device.

As shown in FIGS. 6 and 8, peak power reducer 102 determines that original power signals 652 and 656 were in phase. Thus, shifting one of the original power signals by half a cycle caused the resulting power signals 652 and 856 to be 180 degrees out of phase.

In general, peak power reducer 102 may determine any relative phase difference between any number of power signals and may determine to shift one or more power signals by any amount such that the resulting power signals are not in phase. For example, there may be a tradeoff between a value for peak power consumption and an amount to delay a signal. In particular, it may be costly to delay a signal by any amount, and as the amount of delay increases, the cost may increase exponentially. In this case, it may be desirable to consider the benefit of peak power consumption reduction. In an example, if the cost of delaying a signal outweighs the benefit of reducing the peak power, it may be desirable to delay the signal by as little as is necessary to meet a peak power requirement (i.e., a threshold amount). In other words, it may not be desirable to shift the signals such that the resulting power signals are 180 degrees out of phase. In general, the desired amount of shift in a signal may depend on the phase of one or more other signals, the cost of delaying the signal, peak power requirements, or any other constraints.

FIGS. 9-10 show examples of power signals indicative of amounts of consumed power during transitions in a data bus signal in a device, in accordance with an illustrative embodiment of the present disclosure. In particular, FIG. 9 shows example original signals 106, which may be provided as input to peak power reducer 102, and FIG. 10 shows example shifted signals 118.

FIG. 9 shows a diagram 900, which includes two data bus signals 970 and 974, two power signals 972 and 976, and a combined power signal 978. The data bus signals 970 and 974 are each indicative of data transfer over a channel. For example, data bus signal 970 has binary values (i.e., zero and one), and has a high value when data is being transferred over a first channel and a low value when no data is being transferred over the first channel. Similarly, data bus signal 974 is a binary signal indicative of when data is being transferred over a second channel.

Similarly, the power signals 972 and 976 are representative of amounts of power consumed by the device resulting from the transitions from high to low and low to high in the data bus signals 970 and 974, respectively. In particular, the power signal 972 has short transients when data bus signal 970 transitions from high to low and low to high, and power signal 976 has short transients when data bus signal 974 transitions from high to low and low to high.

In an example, receiver 109 in peak power reducer 102 receives the power signals 972 and 976 from signal source 104. Then, signal combiner 110 combines the power signals 972 and 976 to generate combined power signal 978. In particular, combined power signal 978 may be based on a sum of the power signals 972 and 976, or, in general, may be based on any linear combination of the power signals 972 and 976. After combined power signal 978 is generated, peak identifier 112 identifies a peak value of combined power signal 978, and peak power reducer 102 may then compare the identified peak value to a predetermined threshold value. If the identified peak value is higher than the threshold, peak power reducer 102 may determine to shift one or more of the original data bus signals 970 and 974, or, equivalently, to shift one or more of the original power signals 972 and 976. By shifting one or more of the original signals in time, peak power reducer 102 reduces an amount of peak power consumption in the device.

In general, to determine an appropriate length of time to shift a signal, peak power reducer 102 may identify an appropriate interval (i.e., corresponding to a cycle of data bus signals 970 or 974) and shift the data busy signal 974 or power signal 976 by a suitable amount such that the transients in the shifted power signal are not aligned with the transients in power signal 972.

FIG. 10 shows a diagram 1000 of shifted power signals in a device, in accordance with an illustrative embodiment of the present disclosure. As in diagram 900, diagram 1000 includes a data bus signal 970 and a corresponding power signal 972 representative of amounts of power consumed by the device. Data bus signal 970 and power signal 972 in diagram 1000 are the same signals as shown in diagram 900. In addition, diagram 1000 includes a shifted data bus signal 1074 indicative of times of data transmission over a second channel and a corresponding shifted power signal 1076.

Shifted data bus signal 1074 and shifted power signal 1076 correspond to shifted versions of original data bus signal 974 and original, power signal 976 in FIG. 9. In particular, peak power reducer 102 may identify a relative phase of data bus signals 970 and 974 or of power signals 972 and 976. As shown in FIG. 9, the power signals 972 and 976 are in phase, or aligned. Signal portion identifier 114 may then identify a portion of data bus signal 974 and/or original power signal 976 to shift such that the transients of the resulting power signal is not aligned with the original power signal 976. Thus, signal portion shifter 116 may delay power signal 976 by a half cycle to produce shifted power signal 1076. In this case, shifted power signal 1076 is 180 degrees out of phase with original power signal 972. Because the power signals are out of phase, the resulting combined power signal 1078 does not have the high peaks as shown in the original combined power signal 978. Thus, the combined power signal 1078 has a lower peak amplitude than the original combined power signal 978. By shifting one of the power signals by an amount of time such that the power signals 972 and 1076 are not aligned, peak power reducer 102 reduces an amount of peak power consumption in the device.

As shown in FIGS. 9 and 10, peak power reducer 102 determined that original power signals 972 and 976 were aligned. Thus, shifting one of the original power signals by half a cycle caused the resulting power signals 972 and 1076 to be unaligned. In general, peak power reducer 102 may determine any relative phase difference between the received power signals and may determine to shift one or more power signals by any appropriate amounts such that the resulting power signals are not in phase, or such that the resulting combined power signal has a lower peak amplitude than the original combined power signal.

The systems and methods described herein describe reducing an amount of peak power consumption over two power signals representative of amounts of power consumption over two channels. In general, one of ordinary skill in the art will understand that the systems and methods described herein may be extended to reducing an amount of peak power consumption over any number of power signals representative of power consumption over any number of channels.

Figure 11:
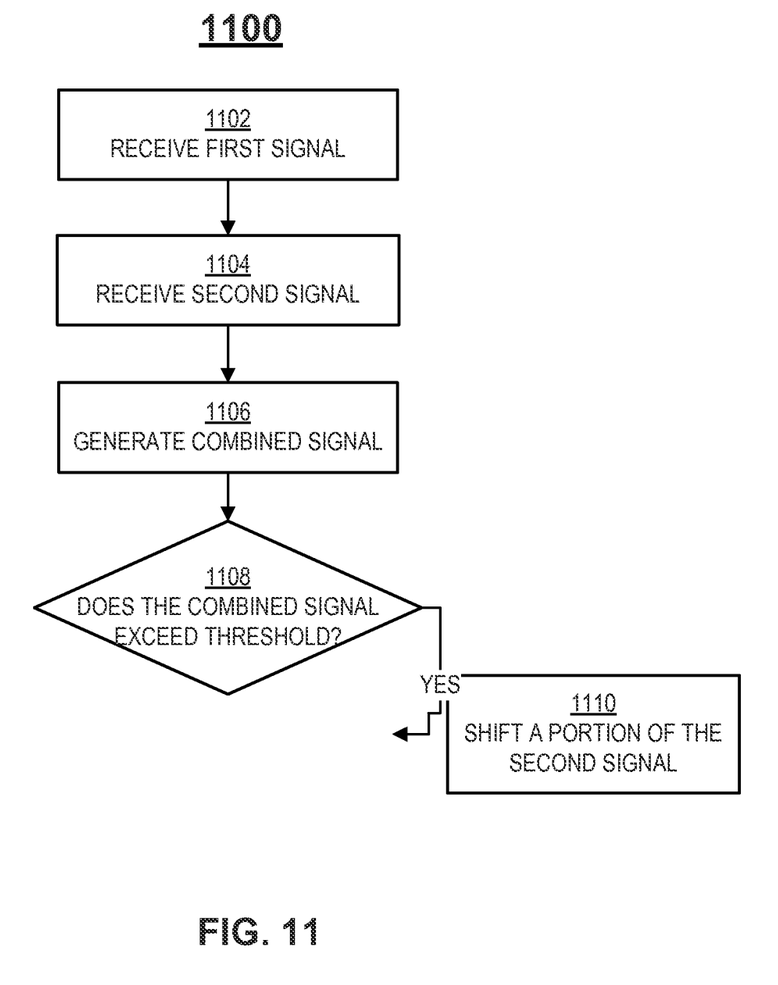
FIG. 11 shows a flow diagram of a method for determining whether to shift a portion of a power signal, in accordance with an embodiment of the disclosure.

FIG. 11 shows a flow diagram of a process 1100 for determining whether to shift a portion of a power signal, in accordance with an embodiment of the disclosure. Process 1100 includes receiving a first signal (1102), receiving a second signal (1104), and generating a combined signal (1106). Process 1100 further includes determining whether the combined signal exceeds a threshold (1108), and if so, shifting a portion of the second signal (1110).

At 1102, receiver 109 receives a first, signal from signal source 104. The first signal is an original signal 106 and may correspond to a power signal such as power signals 332, 972, or 652. In certain implementations, the first signal is power signal 332 or 972 and is representative of an amount of power consumed by a device when data is transferred over a first channel. In particular, the first signal may be a power signal corresponding to data bus signals 330 or 970. In other implementations, the first signal is a data bus signal such as data bus signals 330 or 970. When the first signal is a data bus signal, the first signal may have binary values (i.e., zero and one), and has a high value when data is being transferred over the first channel and a low value when no data is being transferred over the first channel. In this case, peak power reducer 102 may derive a corresponding power signal based on the first signal. The derived power signal may correspond to power signals 332 or 972.

In certain implementations, the first signal is power signal 652 and is representative of an amount of power consumed by a device when a channel in a device is in a certain state. For example, power signal 652 near zero when a first channel in the device is in a ready state (i.e., when ready/busy signal 650 is high) and sinusoidal when the first channel is in a busy state (i.e., when ready/busy signal 650 is low). In other implementations, the first signal is a ready/busy signal such as ready/busy signal 650. When the first signal is a ready/busy signal, the first signal may have binary values (i.e., zero and one), and has a high value when the first channel is in a ready state and a low value when the first channel is in a busy state. In this case, peak power reducer 102 may derive a corresponding power signal based on the first signal. The derived power signal may correspond to power signal 652.

At 1104, receiver 109 receives a second signal from signal source 104. As described above for the first signal, the second signal is an original signal 106 and may correspond to a power signal such as power signals 336, 976, or 656. In certain implementations, the second signal is power signal 336 or 976 and is representative of an amount of power consumed by a device when data is transferred over a second channel. In other implementations, the second signal is a data bus signal such as data bus signals 334 or 974. In this case, peak power reducer 102 may derive a corresponding power signal based on the first signal. The derived power signal may correspond to power signals 336 or 976.

In certain implementations, the second signal is power signal 656 and is representative of an amount of power consumed by a device when a channel in a device is in a certain state. In other implementations, the second signal is a ready/busy signal such as ready/busy signal 654. In this case, peak power reducer 102 may derive a corresponding power signal based on the second signal. The derived power signal may correspond to power signal 656.

At 1106, signal combiner 110 generates a combined signal based on the first signal and the second signal. In certain implementations, the combined signal is a sum of the first signal and the second signal, if the first and second signals are power signals representative of amounts of power consumed by the device. Otherwise, the combined signal may be a sum of power signals derived from the first and second signals, as described above. In general, the combined signal may be a linear combination of the first and second signals.

As described above, the combined signal is based on a received first signal and a received second signal. In general, the systems and methods described herein are not limited to two received signals and are applicable to any number of signals.

At 1108, peak power reducer 102 determines whether the combined signal exceeds a threshold. In particular, peak identifier 112 may identify a maximum amount of combined power in the combined signal generated at 1106. The identified maximum may be compared to a predetermined threshold, which may be set by a user or derived from a user input. The threshold may correspond to a maximum amount of power consumption that is tolerable for the device. For example, a user may set a maximum amount of power consumption tolerable for the device. Alternatively, peak power reducer 102 may be configured to allow the threshold to vary with time. For example, the power consumption constraints for a first device may be dependent on the amounts of peak power consumption of a second device. In particular, when the second device consumes a large amount of power, the threshold of maximal power consumption tolerable for the first device may be smaller than when the second device consumes a smaller amount of power. In general, the threshold may be set in any number of ways and may be fixed or varied with time.

At 1110, if peak power reducer 102 determines that the combined signal exceeds the threshold, a portion of the second signal is shifted. In certain implementations, signal portion identifier 114 identifies a portion of the second signal and/or the first signal to shift. In certain implementations, the identified portion(s) is uniformly shifted, meaning that the entire portion(s) is shifted by a constant amount (i.e., FIGS. 4, 7, 8, and 10). In other implementations, the identifier portion (s) is non-uniformly shifted, such that different portions of the same signal are shifted by different amounts (i.e., FIG. 5). These various implementations of ways to shift one or more signals are described in more detail in relation no FIG. 12.

Figure 12:
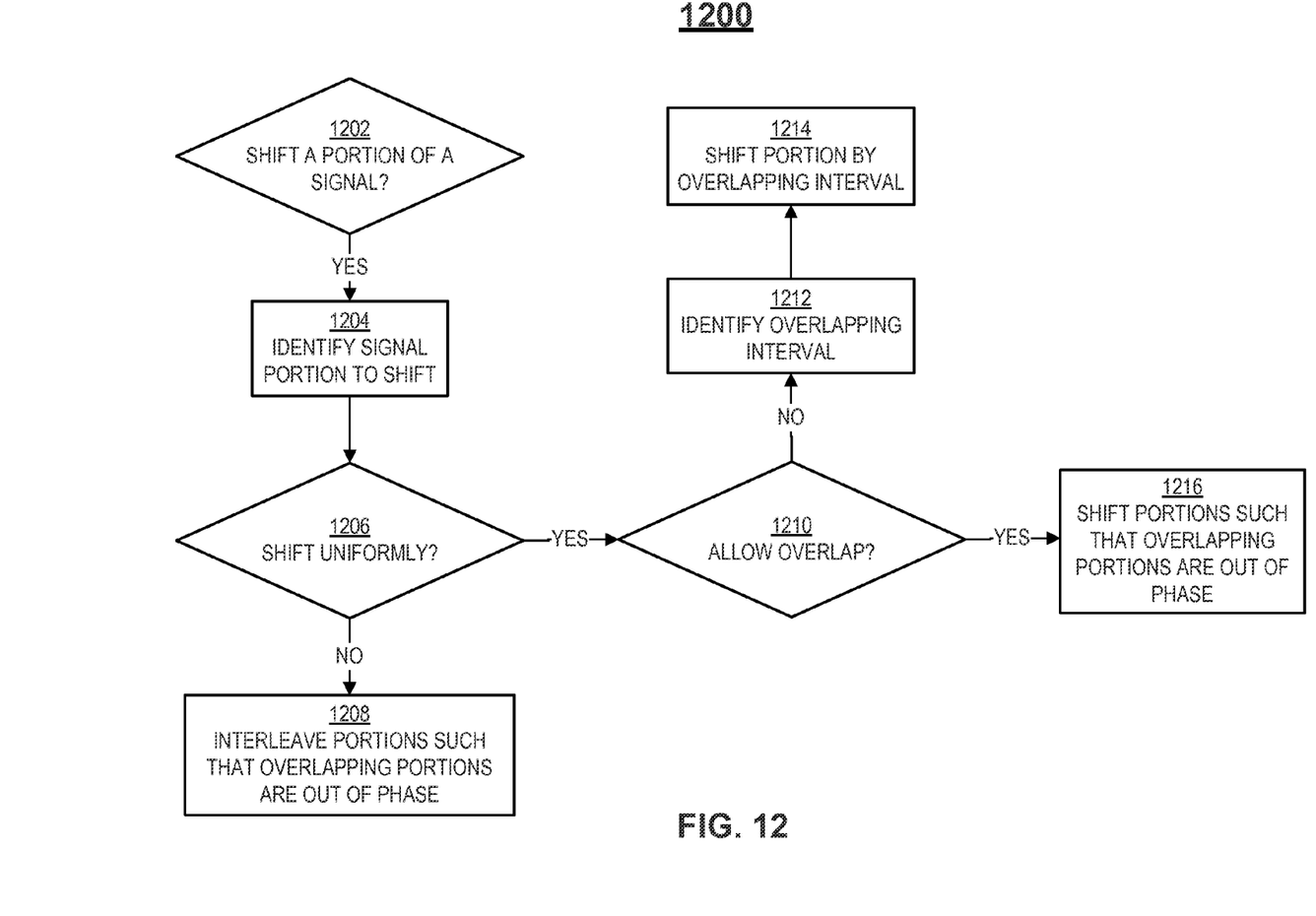
FIG. 12 shows a flow diagram of a method for shifting a portion of a power signal, in accordance with an embodiment of the disclosure.

FIG. 12 shows a flow diagram of a process 1200 for determining how to shift, a portion of a power signal, in accordance with an embodiment of the disclosure. Process 1200 includes determining to shift a portion of a signal (1202) and identifying a signal portion to shift (1204). If it is undesirable to shift the signal portion uniformly (1206), signal portions are interleaved such that any overlapping portions are out of phase with each other (1208). Otherwise, if it is desirable to shift the signal portions uniformly (1206), and to allow overlap (1210), signal portions are shifted such that overlapping portions are out of phase. Otherwise, if it is desirable to not allow overlap (1210), an overlapping interval is identified (1212), and a signal portion is shifted by the overlapping interval (1214).

At 1202, peak power reducer 102 determines to shift a portion of a signal. In an example, determining to shift a portion of a signal occurs when determining that a combined power signal exceeds a threshold, such as at 1108 of FIG. 11. In general, peak power reducer 102 may use any other reason to determine to shift a portion of a signal.

At 1204, signal portion identifier 114 identifies a portion of a signal to shift. For example, one or more portions of one or more signals may be identified. In particular, it may be desirable to shift a portion of one signal. In other implementations, it may be desirable to shift portions of two signals.

At 1206, peak power reducer 102 determines whether to shift the identified portion uniformly. For example, peak power reducer 102 may determine whether it is desirable to shift power signal 336 uniformly such that the rate of data transfer is unchanged (i.e., power signal 436 in FIG. 4). In particular, it may be expensive to shift a signal portion non-uniformly, and simpler operations may be less costly. In addition, it may be desirable to keep the rate of data transfer unchanged. In these cases, it may be desirable to perform uniform shifting of the portion of the signal.

Alternatively, it may be desirable to shift a portion of a signal non-uniformly if changing the data rate is tolerable, and if it is desirable to have some overlapping interval across different channels. In an example, peak power reducer 102 may determine to shift non-uniformly, such that the rate of data transfer is changed (i.e., power signals 532 and 536 in FIG. 5).

At 1208, if it is desirable to shift portions non-uniformly, signal portion shifter 116 interleaves the signal portions such that overlapping portions are out of phase with one another. For example, different portions of the first and second signals may be identified and delayed or advanced by different amounts of time. As described in relation to FIG. 5, when data is being transmitted over both channels, the rate of data transfer may be different for different portions of the same signal. In particular, portions of the data bus signals 530 and 534 may have slower rates (i.e., portions 542 and 544) than other portions (i.e., portions 540 and 546). The portions with slower rates may overlap in time with each other and are interleaved, or out of phase, such that, at any given time, data is not simultaneously transmitted over both channels.

If it is desirable to shift portions uniformly, it is then also determined whether it is desirable to allow portions to overlap at 1210. As an example, peak power reducer 102 may allow portions to overlap when it is important for the combined power profile to be short in time (i.e., combined power signal 858). Otherwise, peak power reducer 102 may disallow portions to overlap when it is undesirable to consider relative phases of different power profiles.

If portions are not allowed to overlap, at 1212, peak power reducer 102 identifies an overlapping interval. The overlapping interval may correspond to interval 335 in FIG. 3 or interval 655 in FIG. 6. In certain implementations, an overlap interval is identified such as overlap interval 335, corresponding to an interval during which the combined power signal 338 exceeds a threshold (which may be the same or different from the threshold used at 1108). After the overlap interval is identified, signal portion identifier 114 may identify a portion of the second power signal (signal 336, for example) to shift. The identified portion of the second power signal 336 may correspond to interval 333, or when data is transmitted over the second channel. At 1214, signal portion shifter 116 delays the identified portion by an amount of time corresponding to the overlap interval 335, resulting in shifted power signal 436 in FIG. 4.

In other implementations, signal portion shifter 116 shifts portions of both the first signal and the second signal. In particular, signal portion identifier 114 may identify portions of both first and second signals to shift. For example, the displayed portion of power signal 332 may be advanced in time by an amount corresponding to half the overlap interval 335, and the displayed portion of power signal 336 may be delayed in time by half the overlap interval 335. In this case, the resulting shifted power signals do not overlap, and the amount of peak power consumption is reduced. In general, one or more signals may be shifted to reduce an amount of overlap between time intervals during which data is transmitted over multiple channels.

In other implementations, the overlapping interval identified at 1212 is overlap interval 655 in FIG. 6. At 1214, the portion of power signal 656 corresponding to interval 653 is delayed by an amount corresponding to the overlap interval 655 (i.e., resulting in shifted power signal 756). In other implementations, signal portion shifter 116 shifts portions of both the first signal and the second signal. In this case, both signals 652 and 656 are shifted such that the resulting shifted signals do not overlap with each other.

Alternatively, if portions are allowed to overlap at 1210, signal portion shifter 116 shifts portions of the signals such that any overlapping portions are out of phase. For example, original power signal 656 is delayed a half cycle, resulting in shifted power signal 856, which is 180 degrees out of phase with original power signal 652. In another example, original power signal 976 is delayed a half cycle, resulting in shifted power signal 1076, which is not aligned with original power signal 972.

The systems and methods described herein include reducing an amount of peak power consumption in a device with two channels, where each channel is associated with a data bus signal, a ready/busy signal, and a power signal. In general, one of ordinary skill in the art will understand that the systems and methods described herein are applicable to devices with any number of channels, and any type of signal may be used to indicate an amount of power consumed by a channel as a function of time. The disclosure herein is generally applicable to shifting any number of portions of any number of signals such that an amount of peak power consumption in a device is reduced. As described herein, the shifting may be performed in any number of ways, including uniformly, non-uniformly, advancing, delaying, any other suitable method for shifting a portion of a signal, or any combination thereof.

Figure 13:
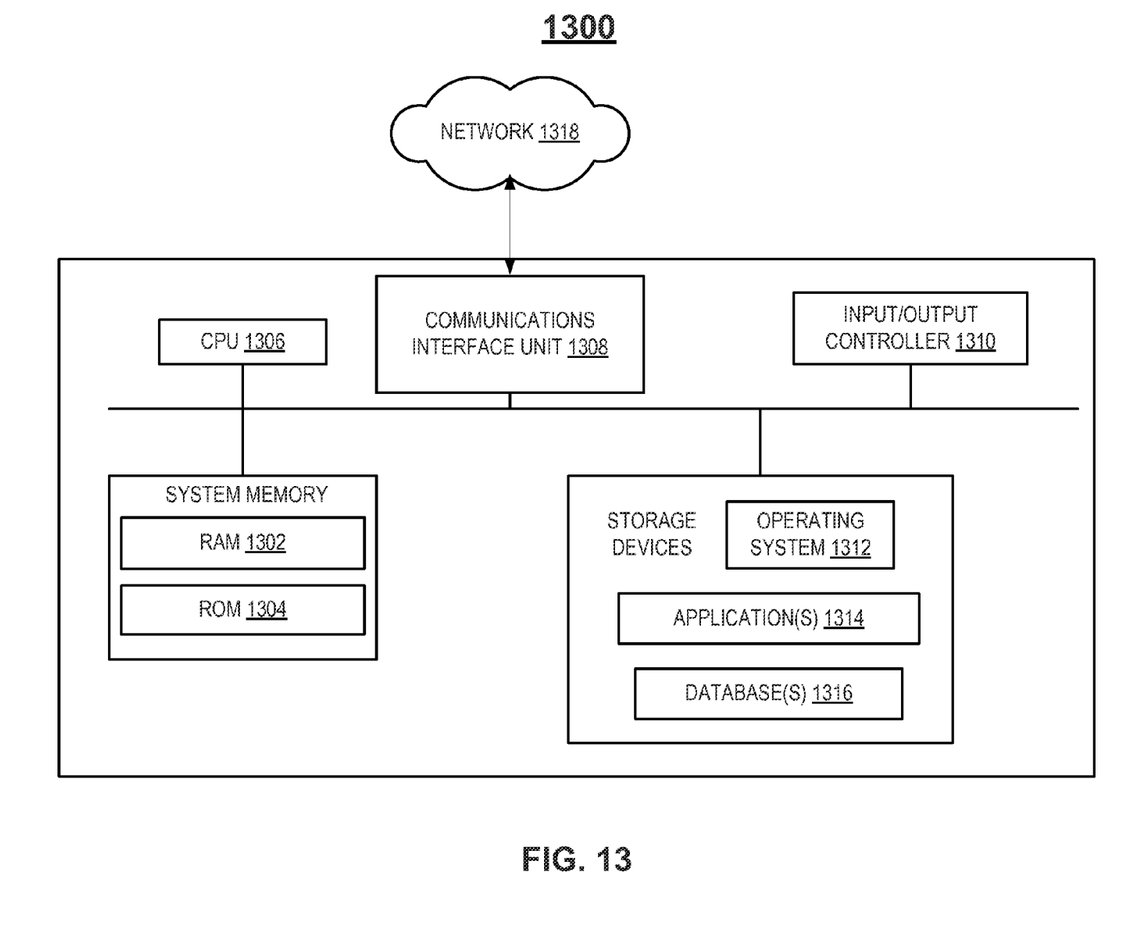
FIG. 13 shows an illustrative block diagram of a computing device, in accordance with an embodiment of the disclosure.

FIG. 13 shows an illustrative block, diagram of a computing device, such as any of the components of the system of FIG. 1, for performing any of the processes described herein. Although the disclosure herein is described as computing device 1300 for reducing an amount of peak power consumption, any one or more portions of computing device 1300 may be used alone to perform any of the processes described herein. As an example, system 100 may be coupled to CPU 1306, and it will be understood that CPU 1306 may alone perform any of the processes described herein. Computing device 1300 may be used to determine a desirable mode of operation, and configure the position of switches (i.e., opening or closing) based on the desired operational mode. Each of the components of these systems may be implemented on one or more computing devices 1300. In certain aspects, a plurality of the components of these systems may be included within one computing device 1300. In certain implementations, a component and a storage device may be implemented across several computing devices 1300.

The computing device 1300 comprises at least one communications interface unit, an input/output controller 1310, system memory, and one or more data storage devices. The system memory includes at least one random access memory (RAM 1302) and at least one read-only memory (ROM 1304). All of these elements are in communication with a central processing unit (CPU 1306) to facilitate the operation of the computing device 1300. The computing device 1300 may be configured in many different ways. For example, the computing device 1300 may be a conventional standalone computer or alternatively, the functions of computing device 1300 may be distributed across multiple computer systems and architectures. In FIG. 13, the computing device 1300 is linked, via network 1318 or local network, to other servers or systems.

The computing device 1300 may be configured in a distributed architecture, wherein databases and processors are housed in separate units or locations. Some units perform primary processing functions and contain at a minimum a general controller or a processor and a system memory. In distributed architecture implementations, each of these units may be attached via the communications interface unit 1308 to a communications hub or port (not shown) that serves as a primary communication link with or servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUE-TOOTH™, GSM and TCP/IP.

The CPU 1306 comprises a processor, such as one or more conventional microprocessors and one or more supplementary co-processors such as math co-processors for offloading workload from the CPU 1306. The CPU 1306 is in communication with the communications interface unit 1308 and the input/output controller 13110, through which the CPU 1306 communicates with other devices such as other servers, user terminals, or devices. The communications interface unit 1308 and the input/output controller 1310 may include multiple communication channels for simultaneous communication with, for example, other processors, servers or client terminals.

The CPU 1306 is also in communication with the data storage device. The data storage device may comprise an appropriate combination of magnetic, optical or semiconductor memory, and may include, for example, RAM 1302, ROM 1304, flash drive, an optical disc such as a compact disc or a hard disk or drive. The CPU 1306 and the data storage device each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1306 may be connected to the data storage device via the communications interface unit 1308. The CPU 1306 may be configured to perform one or more particular processing functions.

The data storage device may store, for example, (i) an operating system 1312 for the computing device 1300; (ii) one or more applications 1314 (e.g., computer program code or a computer program product) adapted to direct the CPU 1306 in accordance with the systems and methods described here, and particularly in accordance with the processes described in detail with regard to the CPU 1306; or database(s) 1316 adapted to store information that may be utilized to store information required by the program.

The operating system 1312 and applications 1314 may be stored, for example, in a compressed, an uncompiled and an encrypted format, and may include computer program code. The instructions of the program may be read into a main memory of the processor from a computer-readable medium other than the data storage device, such as from the ROM 1304 or from the RAM 1302. While execution of sequences of instructions in the program causes the CPU 1306 to perform the process steps described herein, hard-wired circuitry may be used in place of or in combination with, software instructions for implementation of the processes of the present disclosure. Thus, the systems and methods described are not limited to any specific combination of hardware and software.

Suitable computer program code may be provided for performing one or more functions in relation to reducing an amount of pear power consumption as described herein. The program also may include program elements such as an operating system 1312, a database management system and "device drivers" that allow the processor to interface with computer peripheral devices (e.g., a video display, a keyboard, a computer mouse, etc.) via, the input/output controller 1310.

The term "computer-readable medium" as used herein refers to any non-transitory medium that provides or participates in providing instructions to the processor of the computing device 1300 (or any other processor of a device described herein) for execution. Such a medium may take many forms, including but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 1306 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 1300 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for reducing an amount of peak power consumption in a semiconductor memory device, comprising:
   receiving a first signal and a second signal, wherein each of the first signal and the second signal is indicative of an amount of power consumed when data is transferred over a respective memory channel in the semiconductor memory device;
   combining the first signal with the second signal to generate a first combined signal; and
   shifting, in response to the first combined signal having a peak amplitude exceeding a threshold, at least a portion of the second signal in time to cause a combination of the first signal and the shifted portion to have a peak amplitude less than a peak amplitude of the first combined signal.

2. The method of claim 1, wherein the semiconductor memory device is a NAND flash device in a solid state drive.

3. The method of claim 1, wherein combining the first signal with the second signal comprises summing the first signal and the second signal.

4. The method of claim 1 further comprising identifying an overlapping interval, during which a first portion of the first signal overlaps in time with a second portion of the second signal.

5. The method of claim 4, wherein the first portion is indicative of data being transferred over a first memory channel, and the second portion is indicative of data being transferred over a second memory channel.

6. The method of claim 4, wherein shifting the portion comprises delaying the second portion by at least the overlapping interval.

7. The method of claim 1, wherein shifting the portion comprises interleaving first portions of the first signal with second portions of the second signal.

8. The method of claim 7, wherein the first portions and the second portions are non-uniformly shifted.

9. The method of claim 1, wherein the first signal includes a first plurality of transients, and the second signal includes a second plurality of transients.

10. The method of claim 9, wherein shifting the portion comprises delaying the second plurality of transients such that the delayed second plurality of transients and the first plurality of transients are asynchronous.

11. A system for reducing an amount of peak power consumption in a semiconductor memory device, comprising:
    a receiver configured to receive a first signal and a second signal, wherein each of the first signal and the second signal is indicative of an amount of power consumed when data is transferred over a respective memory channel in the semiconductor memory device; and
    circuitry configured to:
        combine the first signal with the second signal to generate a first combined signal; and
        shift, in response to the first combined signal having a peak amplitude exceeding a threshold, at least a portion of the second signal in time, causing a combination of the first signal and the shifted portion to have a peak amplitude less than a peak amplitude of the first combined signal.

12. The system of claim 11, wherein the semiconductor memory device is a NAND flash device in a solid state drive.

13. The system of claim 11, wherein the circuitry combines the first signal with the second signal by summing the first signal and the second signal.

14. The system of claim 11, wherein the circuitry is further configured to identify an overlapping interval, during which a first portion of the first signal overlaps in time with a second portion of the second signal.

15. The system of claim 14, wherein the first portion is indicative of data being transferred over a first memory channel, and the second portion is indicative of data being transferred over a second memory channel.

16. The system of claim 14, wherein the circuitry shifts the portion by delaying the second portion by at least the overlapping interval.

17. The system of claim 11, wherein the circuitry shifts the portion by interleaving first portions of the first signal with second portions of the second signal.

18. The system of claim 17, wherein the first portions and the second portions are non-uniformly shifted.

19. The system of claim 11, wherein the first signal includes a first plurality of transients, and the second signal includes a second plurality of transients.

20. The system of claim 19, wherein the circuitry shifts the portion by delaying the second plurality of transients such that the delayed second plurality of transients and the first plurality of transients are asynchronous.

* * * * *